United States Patent
Sekiya

(10) Patent No.: US 9,023,687 B2
(45) Date of Patent: May 5, 2015

(54) PACKAGE SUBSTRATE PROCESSING METHOD

(71) Applicant: Disco Corporation, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/947,512

(22) Filed: Jul. 22, 2013

(65) Prior Publication Data

US 2014/0030850 A1   Jan. 30, 2014

(30) Foreign Application Priority Data

Jul. 25, 2012  (JP) .................................. 2012-164936

(51) Int. Cl.
| | |
|---|---|
| H01L 21/00 | (2006.01) |
| H01L 21/78 | (2006.01) |
| B28D 5/00 | (2006.01) |
| B28D 5/02 | (2006.01) |
| H01L 21/304 | (2006.01) |
| B24B 41/06 | (2012.01) |
| B24B 7/22 | (2006.01) |

(52) U.S. Cl.
CPC .............. *H01L 21/78* (2013.01); *B28D 5/0094* (2013.01); *B28D 5/022* (2013.01); *H01L 21/304* (2013.01); *B24B 41/061* (2013.01); *B24B 7/228* (2013.01)

(58) Field of Classification Search
CPC ... H01L 21/78; H01L 21/304; H01L 21/3043; B24B 7/228; B28D 5/0094; B28D 5/022
USPC .................................................. 438/113, 114
See application file for complete search history.

(56) References Cited

U.S. PATENT DOCUMENTS

| | | | | |
|---|---|---|---|---|
| 6,649,448 | B2 * | 11/2003 | Tomihara ...................... | 438/113 |
| 6,818,550 | B2 * | 11/2004 | Shibata ......................... | 438/633 |
| 8,193,024 | B2 * | 6/2012 | Fujisawa ........................ | 438/64 |
| 2007/0105348 | A1 * | 5/2007 | Sekiya .......................... | 438/464 |
| 2010/0015329 | A1 * | 1/2010 | Nguyen et al. ............... | 427/96.2 |

FOREIGN PATENT DOCUMENTS

| | | | |
|---|---|---|---|
| JP | 2000-124161 | | 4/2000 |
| JP | 2009-142992 | | 7/2009 |
| JP | 2012049430 | A * | 3/2012 |

* cited by examiner

*Primary Examiner* — Fernando L Toledo
*Assistant Examiner* — Christine C Lau
(74) *Attorney, Agent, or Firm* — Greer Burns & Crain, Ltd.

(57) ABSTRACT

A package substrate processing method of dividing a package substrate into a plurality of individual package devices along a plurality of division lines, the package substrate being composed of an electrode plate and a synthetic resin layer formed on the back side of the electrode plate for molding the package devices. The package substrate processing method includes an internal stress relieving step of cutting the electrode plate of the package substrate along a selected one of the division lines to form a relief groove, thereby relieving an internal stress in the package substrate, a resin layer planarizing step of grinding the synthetic resin layer of the package substrate to thereby planarize the synthetic resin layer, and a package substrate dividing step of dividing the package substrate held on a holding table under suction along the division lines.

1 Claim, 9 Drawing Sheets

US 9,023,687 B2

PACKAGE SUBSTRATE PROCESSING METHOD

BACKGROUND OF THE INVENTION

1. Field of the Invention

The present invention relates to a package substrate processing method of dividing a package substrate into a plurality of individual package devices along a plurality of crossing division lines, the package substrate being composed of an electrode plate having the division lines formed on the front side for partitioning a plurality of regions where the package devices are respectively provided and a synthetic resin layer formed on the back side of the electrode plate for molding the package devices.

2. Description of the Related Art

In a semiconductor device fabrication process, a plurality of crossing division lines are formed on the front side of a substantially disk-shaped semiconductor wafer to thereby partition a plurality of regions where a plurality of devices such as ICs and LSIs are respectively formed. The semiconductor wafer is cut along the division lines to thereby obtain the individual devices. Each device thus obtained is packaged to be widely used in electric equipment such as a mobile phone and a personal computer.

A further reduction in size and weight of such electric equipment is desired and there has been developed a packaging technique capable of reducing the size of a semiconductor device package, called Chip Size Package (CSP). As one of the CSP techniques, a packaging technique called Quad Flat Non-lead Package (QFN) has been put into practical use. This packaging technique called QFN is such that a plurality of devices are arranged like a matrix on an electrode plate such as a copper plate so as to be partitioned by a plurality of division lines, the electrode plate having a plurality of connection terminals corresponding to the connection terminals of the devices. Further, the devices are molded with resin from the back side to thereby form a resin layer for integrating the electrode plate and the devices, thus forming a CSP substrate (package substrate). This package substrate is cut along the division lines to obtain the individual package devices (chip size packages) divided from each other.

In general, cutting of the package substrate is performed by a cutting apparatus having a cutting blade. This cutting apparatus includes a jig having a plurality of crossing escape grooves respectively corresponding to the division lines for allowing the escape of the cutting edge of the cutting blade and a plurality of suction holes respectively formed in a plurality of regions partitioned by these escape grooves. This jig is set on a holding table and the package substrate is held on the jig under suction. In this condition, the cutting blade is rotated and the holding table is relatively moved along the division lines of the package substrate, thereby cutting the package substrate along the division lines to obtain the individual package devices divided from each other (see Japanese Patent Laid-open No. 2009-142992, for example).

However, the package substrate mentioned above has a warp because the electrode plate and the devices are integrated with the resin layer formed on the back side of the electrode plate. In dividing the package substrate having a warp into the individual package devices (chip size packages), there is a case that the package substrate cannot be held under suction on the holding table of the cutting apparatus. To solve this problem, there has been proposed a processing method including the steps of preliminarily dividing the package substrate into large parts to such an extent that the warp is dispersed and next dividing each of these large parts into the individual package devices (chip size packages) (see Japanese Patent Laid-open No. 2000-124161, for example).

SUMMARY OF THE INVENTION

In the case of holding the package substrate divided into the large parts to such an extent that the warp is dispersed on the jig or holding table capable of individually holding the package devices (chip size packages) under suction in the condition where the resin layer of the package substrate is in contact with the jig or holding table, there is a problem such that a suction force applied to each package device may partially leak with a decrease in size of each package device as 3 mm square or 2 mm square, causing scattering of the package devices in dividing the package substrate.

It is therefore an object of the present invention to provide a package substrate processing method which can divide the package substrate into the individual package devices without scattering of the package devices in the condition where the package devices of the package substrate are individually reliably held under suction.

In accordance with an aspect of the present invention, there is provided a package substrate processing method of dividing a package substrate into a plurality of individual package devices along a plurality of crossing division lines, the package substrate being composed of an electrode plate having the division lines formed on the front side for partitioning a plurality of regions where the package devices are respectively provided and a synthetic resin layer formed on the back side of the electrode plate for molding the package devices, the package substrate processing method including an internal stress relieving step of cutting the electrode plate of the package substrate along a selected one of the division lines to form a relief groove, thereby relieving an internal stress in the package substrate; a resin layer planarizing step of grinding the synthetic resin layer of the package substrate after performing the internal stress relieving step, thereby planarizing the synthetic resin layer; a package substrate holding step of holding the synthetic resin layer of the package substrate on a holding table under suction after performing the resin layer planarizing step, the holding table having a plurality of crossing grooves respectively corresponding to the division lines and a plurality of suction holes respectively formed in a plurality of regions partitioned by the crossing grooves; and a package substrate dividing step of dividing the package substrate held on the holding table under suction along the division lines.

As described above, the package substrate processing method according to the present invention includes the internal stress relieving step of cutting the electrode plate of the package substrate along a selected one of the division lines to form a relief groove, thereby relieving an internal stress in the package substrate, the resin layer planarizing step of grinding the synthetic resin layer of the package substrate to thereby planarize the synthetic resin layer, the package substrate holding step of holding the synthetic resin layer of the package substrate on a holding table under suction, this holding table having a plurality of crossing grooves respectively corresponding to the division lines and a plurality of suction holes respectively formed in a plurality of regions partitioned by these crossing grooves, and the package substrate dividing step of dividing the package substrate held on the holding table under suction along the division lines. Accordingly, in performing the package substrate dividing step, the plural package devices of the package substrate are reliably held under suction by the vacuum applied to the plural suction holes formed in the holding table, respectively. As a result, the package substrate can be reliably divided into the individual package devices along the division lines without scattering the package devices.

The above and other objects, features and advantages of the present invention and the manner of realizing them will become more apparent, and the invention itself will best be understood from a study of the following description and appended claims with reference to the attached drawings showing some preferred embodiment of the invention.

DETAILED DESCRIPTION OF THE PREFERRED EMBODIMENT

Figure 1A:
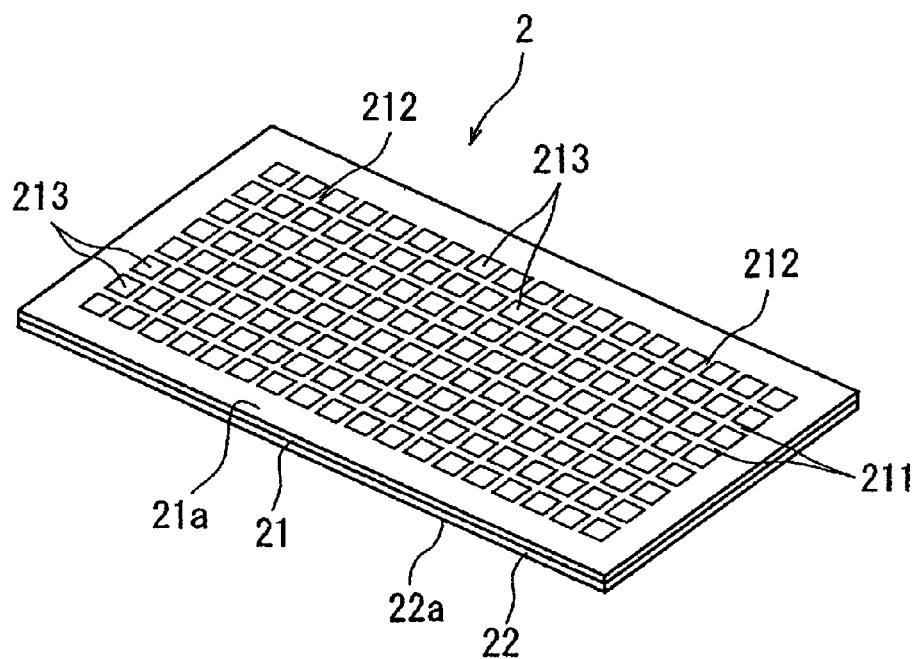
FIG. 1A is a perspective view of a package substrate to be processed by the package substrate processing method according to the present invention.
Figure 1B:
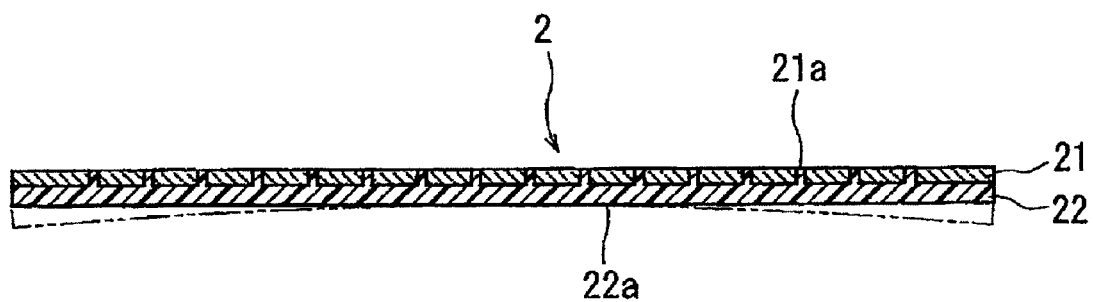
FIG. 1B is a sectional view of the package substrate shown in FIG. 1A.

A preferred embodiment of the package substrate processing method according to the present invention will now be described in detail with reference to the attached drawings. FIG. 1A is a perspective view of a package substrate 2 as a workpiece, and FIG. 1B is a sectional view of the package substrate 2 shown in FIG. 1A. The package substrate 2 includes an electrode plate 21. A plurality of first division lines 211 extending in a first direction and a plurality of second division lines 212 extending in a second direction perpendicular to the first direction are formed on the front side 21a of the electrode plate 21. That is, the first division lines 211 intersect the second division lines 212 at right angles on the front side 21a of the electrode plate 21, thereby partitioning a plurality of rectangular regions where a plurality of package devices 213 are respectively provided. These package devices 213 are molded with a synthetic resin layer 22 from the back side of the electrode plate 21. The package substrate 2 having such a configuration has a slight warp as shown by a phantom line in FIG. 1B. In this description, the lower surface 22a of the synthetic resin layer 22 formed on the back side of the electrode plate 21 (the outer surface of the synthetic resin layer 22 opposite to the inner surface fitted to the back side of the electrode plate 21) as viewed in FIGS. 1A and 1B is defined as the front side 22a of the synthetic resin layer 22.

Figure 2:
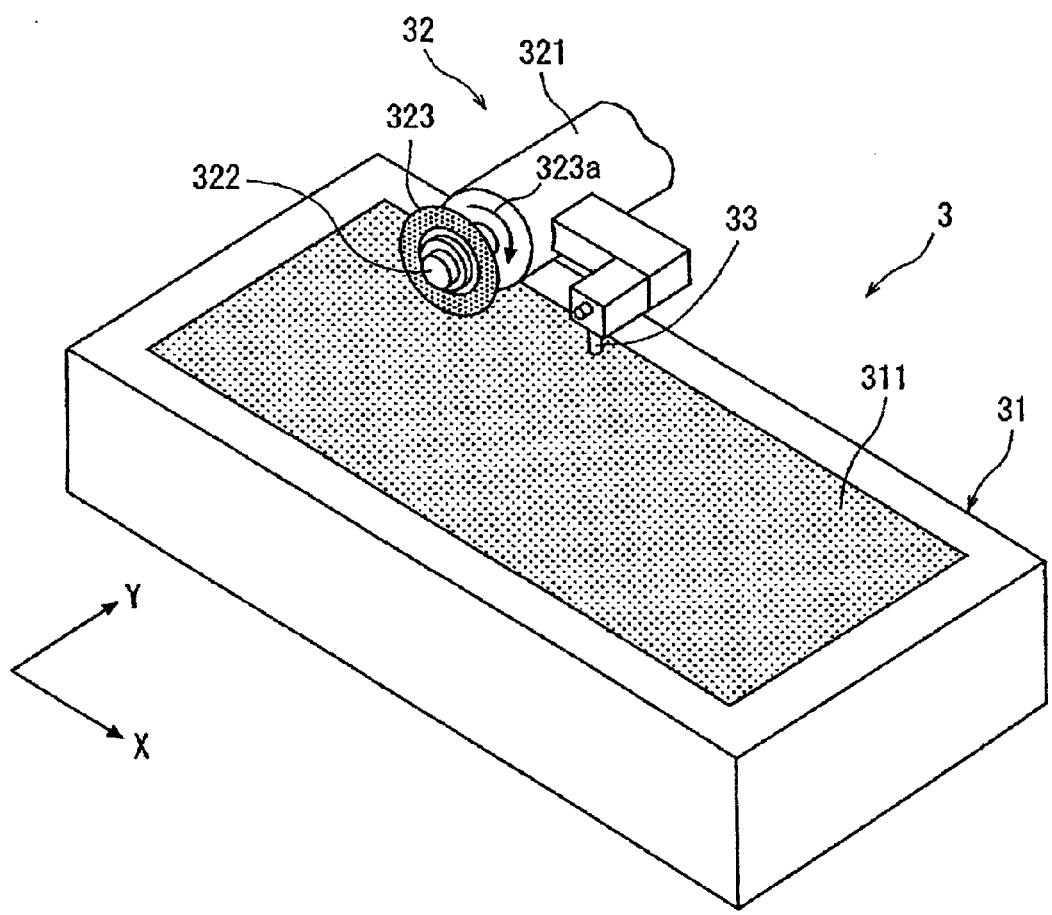
FIG. 2 is a perspective view showing an essential part of a cutting apparatus for performing an internal stress relieving step in the package substrate processing method according to the present invention.

Prior to dividing the package substrate 2 along the first division lines 211 and the second division lines 212, an internal stress relieving step is performed in such a manner that the electrode plate 21 of the package substrate 2 is cut along a selected one of the first division lines 211 and a selected one of the second division lines 212 to form a plurality of relief grooves, thereby relieving an internal stress in the package substrate 2. This internal stress relieving step is performed by using a cutting apparatus 3 shown in FIG. 2. The cutting apparatus 3 shown in FIG. 2 includes a holding table 31 for holding a workpiece, cutting means 32 for cutting the workpiece held on the holding table 31, and imaging means 33 for imaging the workpiece held on the holding table 31. The holding table 31 has a rectangular shape, and an adhesive layer 311 having a tack strength is formed on the upper surface of the holding table 31. The holding table 31 is rotatable by a rotating mechanism (not shown). The holding table 31 is movable by feeding means (not shown) in a feeding direction shown by an arrow X in FIG. 2 and also movable by indexing means (not shown) in an indexing direction shown by an arrow Y in FIG. 2.

The cutting means 32 includes a spindle housing 321 extending in a substantially horizontal direction, a rotating spindle 322 rotatably supported to the spindle housing 321, and a cutting blade 323 mounted on the front end portion of the rotating spindle 322. The rotating spindle 322 is rotatable in the direction shown by an arrow 323a by a servo motor (not shown) provided in the spindle housing 321. The imaging means 33 is provided by optical means including a microscope and a CCD camera. An image signal obtained by the imaging means 33 is transmitted to control means (not shown).

The internal stress relieving step using the cutting apparatus 3 will now be described. First, the synthetic resin layer 22 of the package substrate 2 is attached to the adhesive layer 311 formed on the upper surface of the holding table 31. The warp of the package substrate 2 attached through the synthetic resin layer 22 to the adhesive layer 311 is corrected to some extent by the tack strength of the adhesive layer 311, so that the package substrate 2 is held flatly on the holding table 31 in the condition where the front side 21a of the electrode plate 21 is oriented upward. Thereafter, the holding table 31 holding the package substrate 2 thereon is moved to a position directly below the imaging means 33 by the feeding means (not shown).

In the condition where the holding table 31 is positioned directly below the imaging means 33, an alignment operation is performed by the imaging means 33 and the control means (not shown) to detect a subject area of the package substrate 2 to be cut. More specifically, the imaging means 33 and the control means (not shown) perform image processing such as pattern matching for making the alignment between the cutting blade 323 and the first division lines 211 extending in the first direction on the front side 21a of the electrode plate 21 constituting the package substrate 2, thus performing the alignment for the first division lines 211 (alignment step). Similarly, the alignment is performed for the second division lines 212 extending in the second direction perpendicular to the first direction on the front side 21a of the electrode plate 21.

Figure 3A:
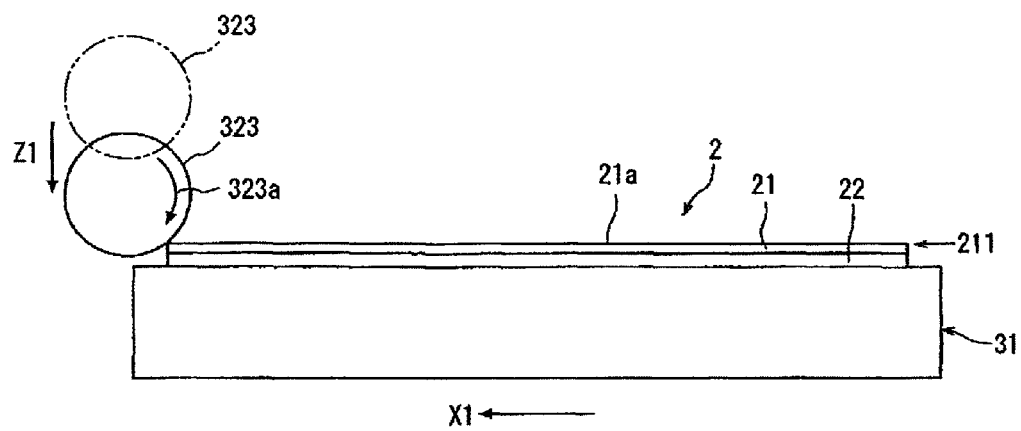
FIGS. 3A to 3C are side views for illustrating the internal stress relieving step.
Figure 3B:
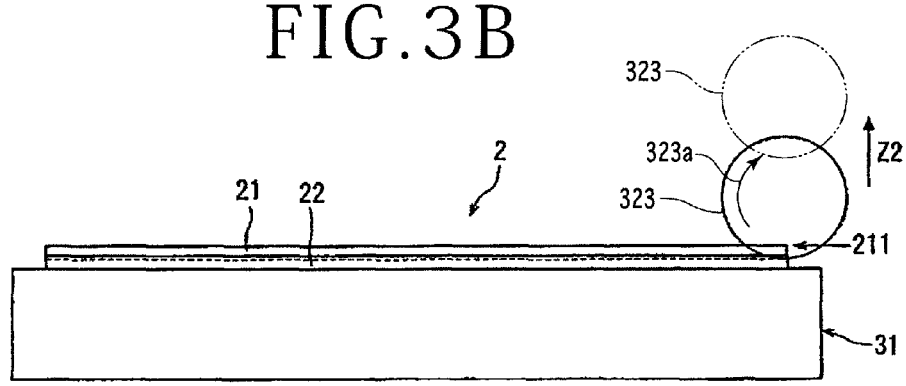
Figure 3C:
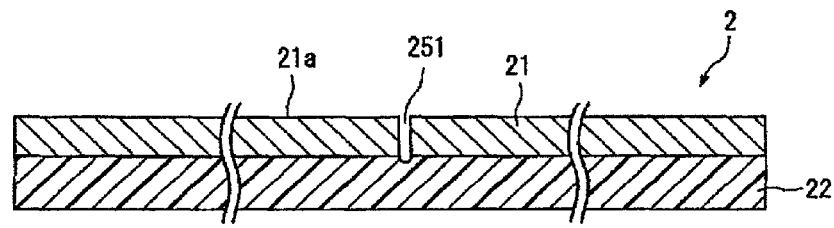

After performing the alignment for detecting the first and second division lines 211 and 212 of the package substrate 2 held on the holding table 31 as mentioned above, the holding table 31 holding the package substrate 2 thereon is moved to a cutting position. That is, as shown in FIG. 3A, one end (left end as viewed in FIG. 3A) of a selected one of the first division lines 211 is positioned on the slightly right side of a position directly below the cutting blade 323 as viewed in FIG. 3A. In this condition, the cutting blade 323 is rotated in the direction of the arrow 323a and is lowered by a predetermined amount in the direction shown by an arrow Z1 from a retracted position shown by a phantom line to a working position shown by a solid line. At this time, the depth of cut by the cutting blade 323 is set so that the lower end of the outer circumference of the cutting blade 323 reaches the synthetic resin layer 22. As keeping the working position of the cutting blade 323, the holding table 31 is moved at a predetermined feed speed in the direction shown by an arrow X1 in FIG. 3A. When the other end (right end as viewed in FIG. 3B) of the selected first division line 211 of the package substrate 2 held on the holding table 31 reaches the slightly left side of the position directly below the cutting blade 323 as viewed in FIG. 3B, the movement of the holding table 31 is stopped and the cutting blade 323 is raised in the direction shown by an arrow Z2 from the working position to the retracted position shown by a phantom line as shown in FIG. 3B. As a result, a first relief groove 251 having a depth reaching the synthetic resin layer 22 is formed along the selected first division line 211 (more specifically, along the first division line 211 at the central position in the lateral direction of the package substrate 2) on the package substrate 2 as shown in FIG. 3C (relief groove forming step).

Figure 4:
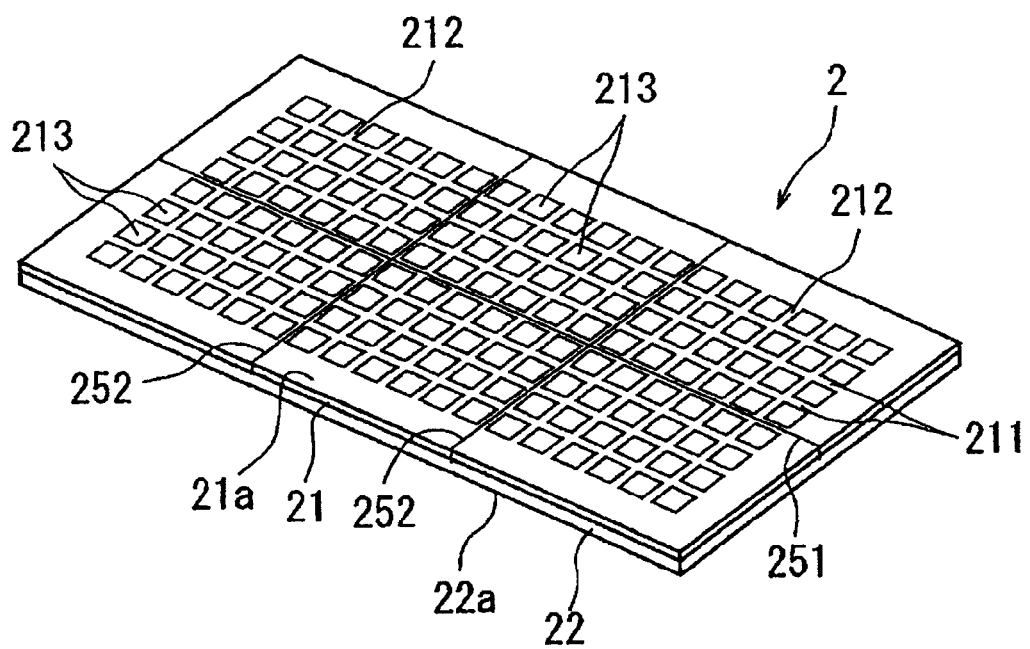
FIG. 4 is a perspective view of the package substrate in the condition obtained by performing the internal stress relieving step.

After performing the relief groove forming step along the selected first division line 211 as mentioned above, the holding table 31 is rotated 90° to similarly perform the relief groove forming step along a selected one of the second division lines 212 of the package substrate 2 held on the holding table 31. More specifically, the relief groove forming step is performed along two selected ones of the second division lines 212 to thereby form two second relief grooves 252 spaced from each other in the longitudinal direction of the package substrate 2 as shown in FIG. 4. Accordingly, by performing the relief groove forming step along the selected first division line 211 and the two selected second division lines 212 as mentioned above, the first relief groove 251 is formed along the selected first division line 211 and the two second relief grooves 252 are formed along the two selected second division lines 212 to thereby cut the electrode plate 21 of the package substrate 2 as shown in FIG. 4. As a result, the internal stress in the package substrate 2 is relieved to thereby remove the warp (internal stress relieving step).

After performing the internal stress relieving step mentioned above, a resin layer planarizing step is performed in such a manner that the synthetic resin layer 22 of the package substrate 2 is planarized by grinding to remove undulation in the synthetic resin layer 22 that cannot be corrected even by the relief grooves 251 and 252. This resin layer planarizing step is performed by using a grinding apparatus 4 shown in FIG. 5. The grinding apparatus 4 shown in FIG. 5 includes a chuck table 41 for holding a workpiece and grinding means 42 for grinding the workpiece held on the chuck table 41. The chuck table 41 has an upper surface provided with a rectangular suction holding portion for holding the package substrate 2 under suction. The suction holding portion is in communication with suction means (not shown). The chuck table 41 is rotatable in the direction shown by an arrow 41a in FIG. 5 by a rotational driving mechanism (not shown). The grinding means 42 includes a spindle housing 421, a rotating spindle 422 rotatably supported to the spindle housing 421 so as to be rotated by a rotational driving mechanism (not shown), a mounter 423 fixed to the lower end of the rotating spindle 422, and a grinding wheel 424 mounted on the lower surface of the mounter 423. The grinding wheel 424 is composed of an annular base 425 and a plurality of abrasive members 426 mounted on the lower surface of the annular base 425 so as to be annularly arranged at given intervals. The annular base 425 is mounted on the lower surface of the mounter 423 by a plurality of fastening bolts 427.

Figure 5:
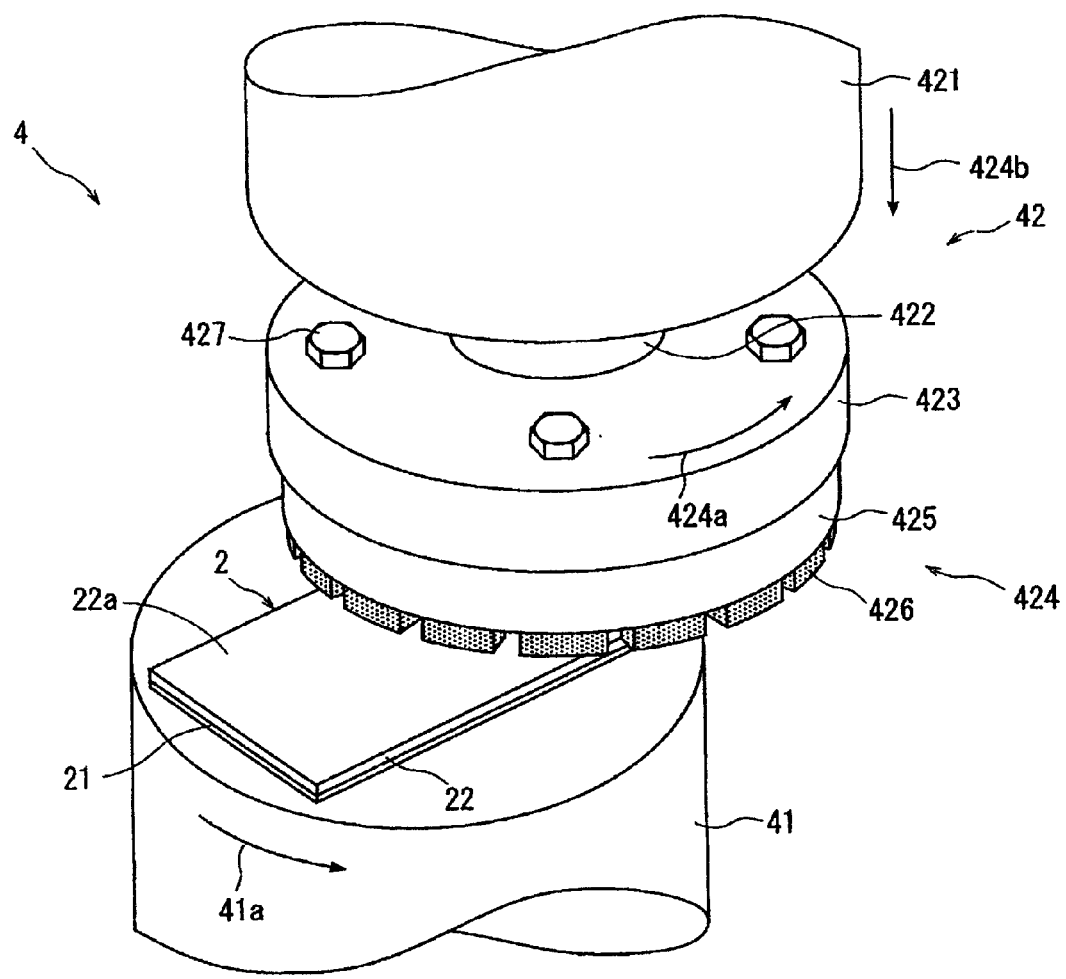
FIG. 5 is a perspective view for illustrating a resin layer planarizing step in the package substrate processing method according to the present invention.
Figure 6:
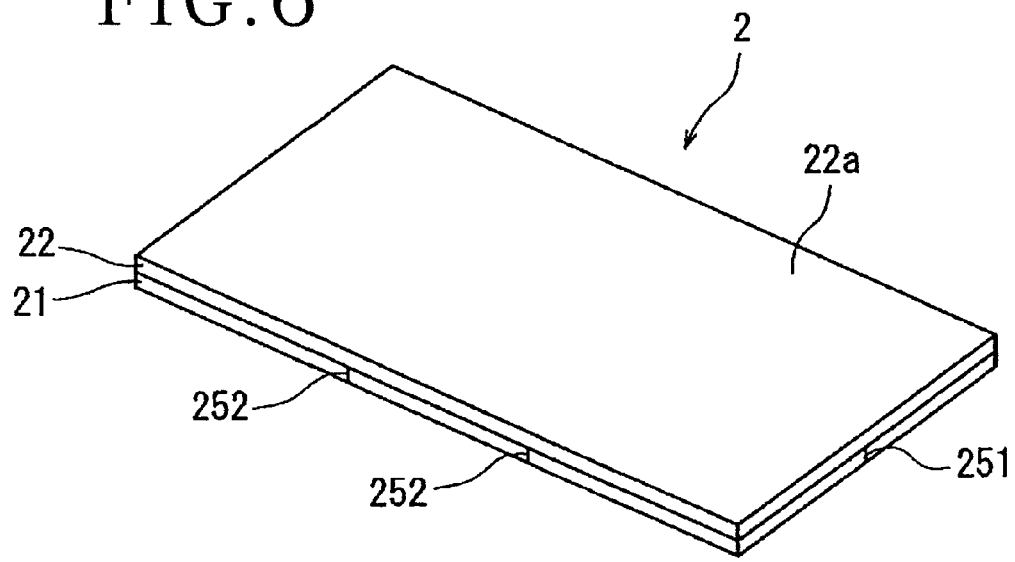
FIG. 6 is a perspective view of the package substrate in the condition obtained by the resin layer planarizing step.

The resin layer planarizing step using the grinding apparatus 4 will now be described. As shown in FIG. 5, the electrode plate 21 of the package substrate 2 processed by the internal stress relieving step is placed on the suction holding portion of the upper surface (holding surface) of the chuck table 41. The suction holding portion has the same shape and size as those of the package substrate 2. Thereafter, the suction means (not shown) is operated to hold the package substrate 2 on the chuck table 41 under suction. At this time, the package substrate 2 is reliably held on the upper surface (holding surface) of the chuck table 41 under suction because the warp of the package substrate 2 has been removed by the internal stress relieving step. Accordingly, the package substrate 2 is held on the chuck table 41 under suction in the condition where the front side 22a of the synthetic resin layer 22 is oriented upward. In the condition where the package substrate 2 is held on the chuck table 41 under suction, the chuck table 41 is rotated at 300 rpm, for example, in the direction of the arrow 41a in FIG. 5. Further, the grinding wheel 424 of the grinding means 42 is also rotated at 6000 rpm, for example, in the direction shown by an arrow 424a in FIG. 5. Thereafter, the abrasive members 426 of the grinding wheel 424 are brought into contact with the front side 22a (work surface) of the synthetic resin layer 22 of the package substrate 2, and the grinding wheel 424 is next fed downward by a predetermined amount in the direction shown by an arrow 424b in FIG. 5 (in the direction perpendicular to the holding surface of the chuck table 41). As a result, the front side 22a of the synthetic resin layer 22 constituting the package substrate 2 is ground to be planarized as shown in FIG. 6.

Figure 7:
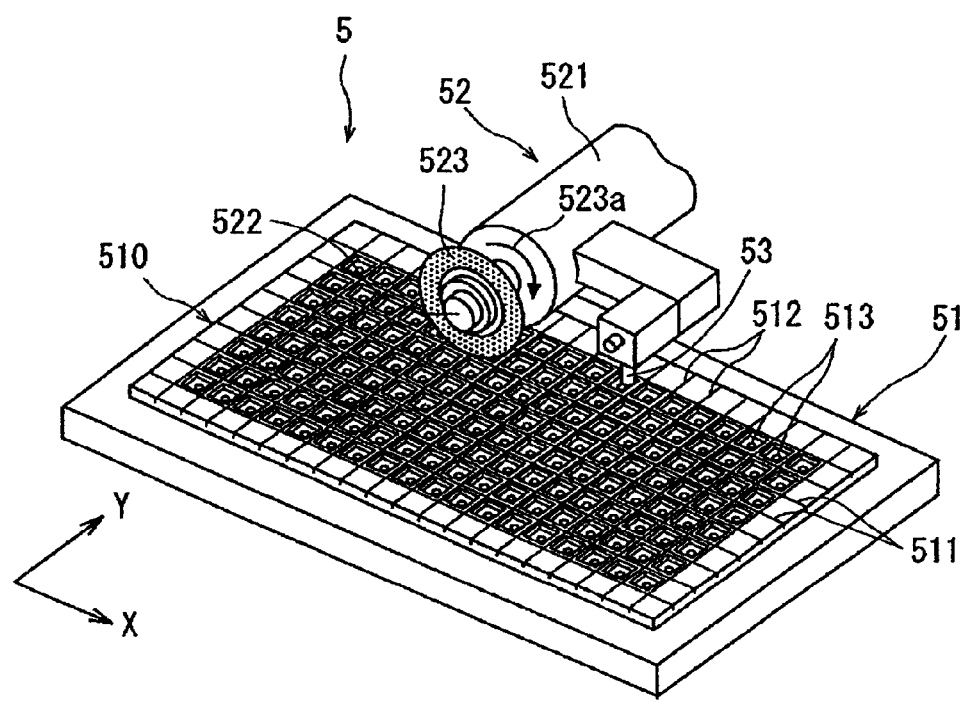
FIG. 7 is a perspective view showing an essential part of a cutting apparatus for performing a package substrate holding step and a package substrate dividing step in the package substrate processing method according to the present invention.

After performing the resin layer planarizing step as mentioned above, a package substrate holding step is performed in such a manner that the synthetic resin layer 22 of the package substrate 2 is held on a holding table under suction, wherein this holding table has a plurality of crossing grooves respectively corresponding to the first and second division lines 211 and 212 and a plurality of suction holes respectively formed in a plurality of regions partitioned by the above crossing grooves. This package substrate holding step is performed by using a cutting apparatus 5 shown in FIG. 7. The cutting apparatus 5 shown in FIG. 7 includes a holding table 51 for holding a workpiece, cutting means 52 for cutting the workpiece held on the holding table 51, and imaging means 53 for imaging the workpiece held on the holding table 51. The holding table 51 has a rectangular shape, and a suction holding portion 510 for holding the package substrate 2 under suction projects from the upper surface of the holding table 51 at a central portion thereof. The upper surface (holding surface) of the suction holding portion 510 is formed with a plurality of first escape grooves 511 respectively corresponding to the first division lines 211 of the package substrate 2 and also formed with a plurality of second escape grooves 512 respectively corresponding to the second division lines 212. These escape grooves 511 and 512 function to allow the escape of a cutting edge of a cutting blade to be hereinafter described. Further, the suction holding portion 510 has a plurality of suction holes 513 respectively formed in a plurality of regions partitioned by the first and second escape grooves 511 and 512. These suction holes 513 are in communication with suction means (not shown). The holding table 51 is rotatable by a rotational driving mechanism (not shown). The holding table 51 is movable by feeding means (not shown) in a feeding direction shown by an arrow X in FIG. 7 and also movable by indexing means (not shown) in an indexing direction shown by an arrow Y in FIG. 7.

The cutting means 52 includes a spindle housing 521 extending in a substantially horizontal direction, a rotating spindle 522 rotatably supported to the spindle housing 521, and a cutting blade 523 mounted on the front end portion of the rotating spindle 522. The rotating spindle 522 is rotatable in the direction shown by an arrow 523a by a servo motor (not shown) provided in the spindle housing 521. The imaging means 53 is provided by optical means including a microscope and a CCD camera. An image signal obtained by the imaging means 53 is transmitted to the control means (not shown).

Figure 8:
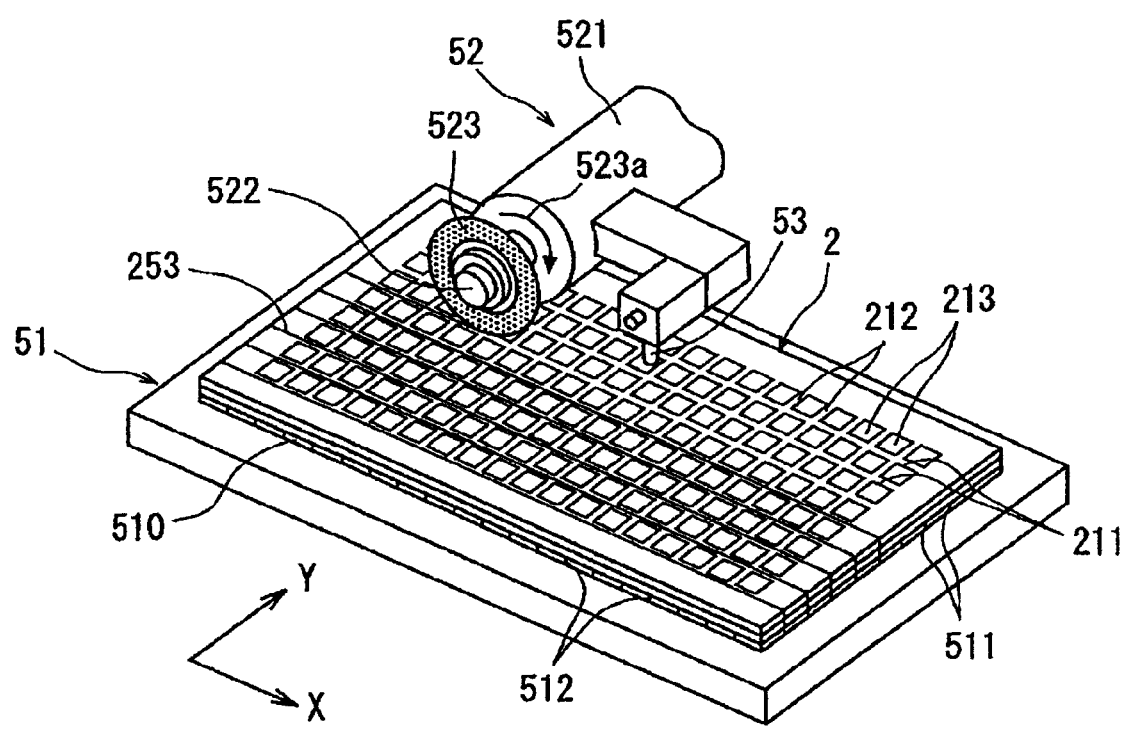
FIG. 8 is a perspective view for illustrating the package substrate holding step.

As shown in FIG. 8, the package substrate holding step using the cutting apparatus 5 will now be described. First, the synthetic resin layer 22 of the package substrate 2 processed by the resin layer planarizing step is placed on the upper surface (holding surface) of the suction holding portion 510 of the holding table 51 of the cutting apparatus 5. Thereafter, the suction means (not shown) is operated to hold the package substrate 2 on the holding table 51 under suction (package substrate holding step). At this time, the front side 22a of the synthetic resin layer 22 of the package substrate 2 is in close contact with the upper surface (holding surface) of the suction holding portion 510 of the holding table 51 because the front side 22a of the synthetic resin layer 22 has been planarized by the resin layer planarizing step. Accordingly, the plural package devices 213 of the package substrate 2 are reliably held under suction by the vacuum applied to the plural suction holes 513 formed in the suction holding portion 510 of the holding table 51, respectively. At this time, the package substrate 2 is held on the holding table 51 under suction in the condition where the front side 21a of the electrode plate 21 is oriented upward.

After performing the package substrate holding step as mentioned above, the holding table 51 holding the package substrate 2 thereon is moved to a position directly below the imaging means 53 by the feeding means (not shown). In the condition where the holding table 51 is positioned directly below the imaging means 53, an alignment operation is performed by the imaging means 53 and the control means (not shown) to detect a subject area of the package substrate 2 to be cut. More specifically, the imaging means 53 and the control means (not shown) perform the alignment operation by imaging the first division lines 211 and the second division lines 212 formed on the package substrate 2 and determining whether or not the first division lines 211 and the second division lines 212 are parallel to the X direction and the Y direction, respectively. Unless the first division lines 211 and the second division lines 212 are parallel to the X direction and the Y direction, respectively, the rotational driving mechanism (not shown) is operated to rotate the holding table 51 so that the first division lines 211 and the second division lines 212 of the package substrate 2 held on the holding table 51 become parallel to the X direction and the Y direction, respectively (alignment step).

Figure 9A:
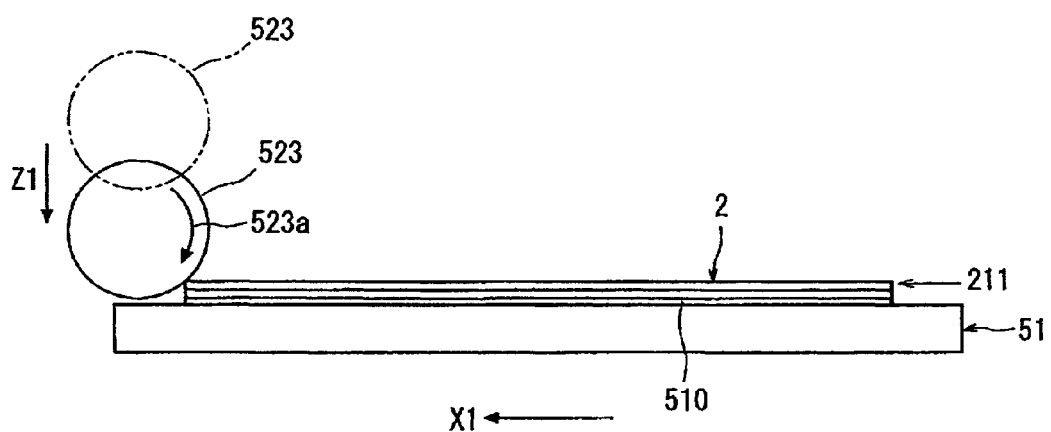
FIGS. 9A and 9B are side views for illustrating the package substrate dividing step.
Figure 9B:
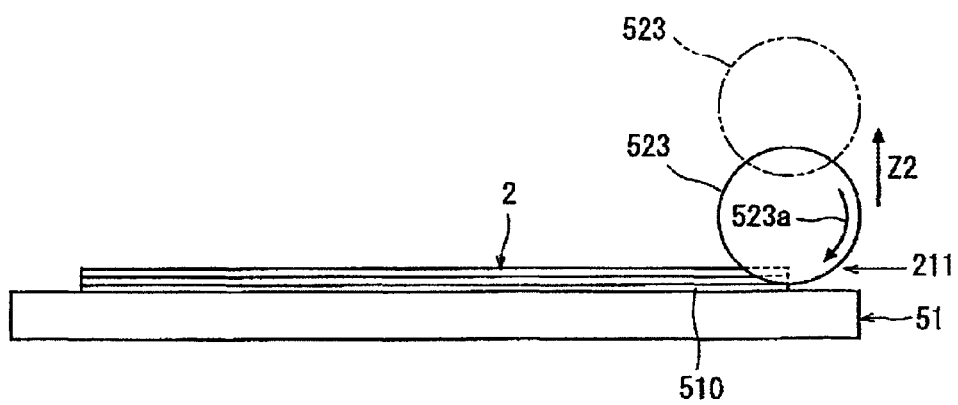

After performing the alignment step mentioned above, the holding table 51 is moved to a cutting position. That is, as shown in FIG. 9A, one end of a predetermined one of the first division lines 211 is positioned on the slightly right side of a position directly below the cutting blade 523 as viewed in FIG. 9A. In this condition, the cutting blade 523 is rotated in the direction of the arrow 523a and is lowered by operating vertical moving means (not shown) by a predetermined amount in the direction shown by an arrow Z1 from a retracted position shown by a phantom line to a working position shown by a solid line as shown in FIG. 9A. At this time, the depth of cut by the cutting blade 523 is set so that the lower end of the outer circumference (cutting edge) of the cutting blade 523 reaches the corresponding escape groove 511 (see FIG. 7) formed in the suction holding portion 510 of the holding table 51. As keeping the working position of the cutting blade 523, the holding table 51 is moved by operating the feeding means (not shown) at a predetermined feed speed in the direction shown by an arrow X1 in FIG. 9A. When the other end of the predetermined first division line 211 of the package substrate 2 held on the holding table 51 reaches the slightly left side of the position directly below the cutting blade 523 as viewed in FIG. 9B, the movement of the holding table 51 is stopped and the cutting blade 523 is raised in the direction shown by an arrow Z2 from the working position to the retracted position shown by a phantom line as shown in FIG. 9B. Thereafter, the indexing means (not shown) is operated to similarly perform the above cutting operation along all of the other first division lines 211. As a result, a plurality of cut grooves 253 extending along all of the first division lines 211 are formed to cut the package substrate 2 as shown in FIG. 10 (cutting step).

Figure 10:
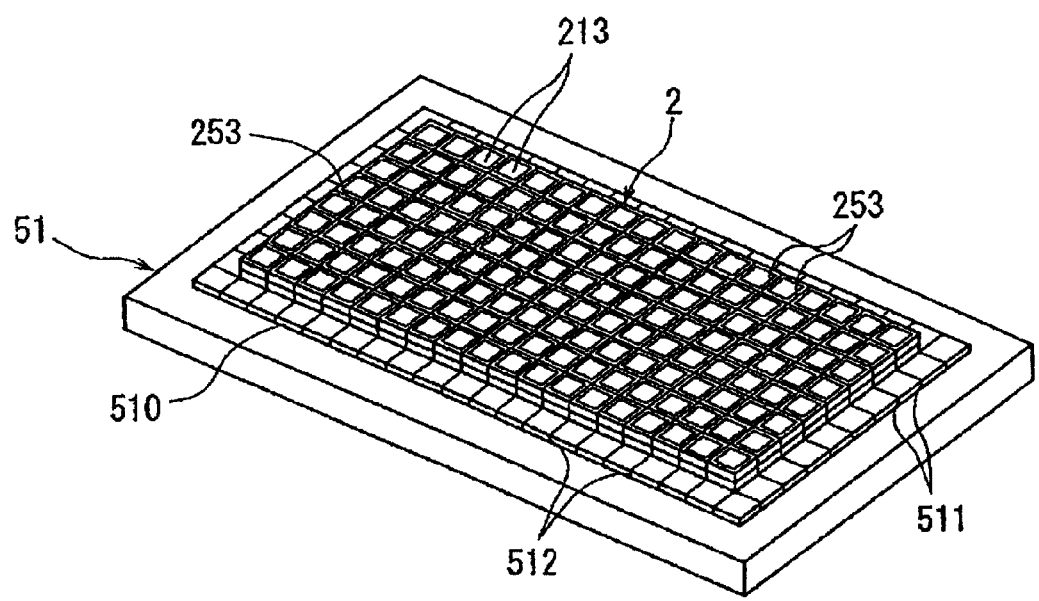
FIG. 10 is a perspective view of the package substrate in the condition obtained by performing the package substrate dividing step.

After performing the cutting step along all of the first division lines 211 extending in the first direction as mentioned above, the holding table 51 is rotated 90° to similarly perform the cutting step along all of the second division lines 212 extending in the second direction perpendicular to the first direction, thereby forming a plurality of similar cut grooves 253 along all of the second division lines 212 as shown in FIG. 10. As a result, the package substrate 2 held on the holding table 51 is cut by the cut grooves 253 along all of the first and second division lines 211 and 212 as shown in FIG. 10. In this manner, the package substrate 2 is cut along all of the first and second division lines 211 and 212 to thereby obtain the individual package devices 213 divided from each other as shown in FIG. 10 (package substrate dividing step). At this time, the individual package devices 213 remain held under suction on the suction holding portion 510 of the holding table 51 to maintain the form of the package substrate 2. However, a peripheral marginal area of the package substrate 2 where the package devices 213 are not formed is not held under suction on the holding table 51, so that this peripheral marginal area falls down from the holding table 51 as scraps in the cutting step.

In the package substrate dividing step as mentioned above, the front side 22a of the synthetic resin layer 22 of the package substrate 2 is in close contact with the upper surface (holding surface) of the suction holding portion 510 of the holding table 51 because the front side 22a of the synthetic resin layer 22 has been planarized by the resin layer planarizing step. Accordingly, the plural package devices 213 of the package substrate 2 are reliably held under suction by the vacuum applied to the plural suction holes 513 formed in the suction holding portion 510 of the holding table 51, respectively. As a result, the package substrate 2 can be reliably divided into the individual package devices 213 along the first and second division lines 211 and 212 without scattering the package devices 213.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A package substrate processing method of dividing a package substrate into a plurality of individual package devices along a plurality of crossing division lines, said package substrate processing method comprising:
forming an electrode plate extending over substantially an entire surface of said package substrate, said electrode plate having said division lines formed on a front side for partitioning a plurality of regions where said package devices are respectively provided and a synthetic resin layer formed on a back side of said electrode plate for molding said package devices, said package substrate processing method further comprising:
an internal stress relieving step of cutting said electrode plate of said package substrate along a selected one of said division lines to form a relief groove, thereby relieving an internal stress in said package substrate;
a resin layer planarizing step of grinding said synthetic resin layer of said package substrate after performing said internal stress relieving step, thereby planarizing said synthetic resin layer;
a package substrate holding step of holding said synthetic resin layer of said package substrate on a holding table under suction after performing said resin layer planarizing step, said holding table having a plurality of crossing grooves respectively corresponding to said division lines and a plurality of suction holes respectively formed in a plurality of regions partitioned by said crossing grooves; and
a package substrate dividing step of dividing said package substrate held on said holding table under suction along said division lines.

* * * * *